United States Patent
Kobayashi et al.

(10) Patent No.: US 7,098,526 B2
(45) Date of Patent: Aug. 29, 2006

(54) BUMPED IC, DISPLAY DEVICE AND ELECTRONIC DEVICE USING THE SAME

(75) Inventors: Kazuo Kobayashi, Suwa (JP); Hidehiko Yajima, Suwa (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 11/046,642

(22) Filed: Jan. 28, 2005

(65) Prior Publication Data

US 2005/0167833 A1 Aug. 4, 2005

(30) Foreign Application Priority Data

Jan. 30, 2004 (JP) .............................. 2004-023029

(51) Int. Cl.
H01L 23/552 (2006.01)
H01L 23/48 (2006.01)

(52) U.S. Cl. ...................... 257/660; 257/659; 257/738; 257/778

(58) Field of Classification Search ................ 257/737, 257/738, 778, 786, E23.21, E23.069, 659, 257/660, 81, 82; 438/613–617
See application file for complete search history.

(56) References Cited

U.S. PATENT DOCUMENTS 5,786,789 A * 7/1998 Janky ....................... 342/357.1
6,232,668 B1 * 5/2001 Hikita et al. ................ 257/777
6,292,248 B1 * 9/2001 Lee et al. ................... 349/149
6,492,692 B1 * 12/2002 Ishii et al. .................. 257/408
6,897,933 B1 * 5/2005 Hoshina ..................... 349/152
6,919,642 B1 * 7/2005 Hsieh et al. ................ 257/778
6,963,385 B1 * 11/2005 Aruga et al. ................ 349/151
2002/0050381 A1 * 5/2002 Takao ........................ 174/52.1
2003/0151055 A1 * 8/2003 Tsuji et al. .................... 257/81

FOREIGN PATENT DOCUMENTS

| JP | 11-024605 | 1/1999 |
|---|---|---|
| JP | 2001-056478 | 2/2001 |
| JP | 2001-154601 | 6/2001 |

* cited by examiner

*Primary Examiner*—Jasmine Clark
(74) *Attorney, Agent, or Firm*—Harness, Dickey & Pierce, P.L.C.

(57) ABSTRACT

A driver IC, which is mounted on an active matrix substrate by means of COG, is provided. The driver IC includes an input-output circuit, an internal circuit region having a plurality of internal circuits, a plurality of substrate-coupling bumps coupled to the input-output circuit, and at least one dummy bump. The dummy bump is placed facing opposite to one of the plurality of internal circuits which becomes an object of light shielding.

8 Claims, 7 Drawing Sheets

BUMPED IC, DISPLAY DEVICE AND ELECTRONIC DEVICE USING THE SAME

RELATED APPLICATIONS

This application claims priority to Japanese Patent Application No. 2004-023029 filed Jan. 30, 2004 which is hereby expressly incorporated by reference herein in its entirety.

BACKGROUND

1. Technical Field

The present invention relates to a bumped IC comprising a light-shielding dummy bump, as well as a display device and an electronic device using the bumped IC.

2. Related Art

In a liquid crystal display device, for example, there is a technique known as chip-on-glass (COG), wherein a driver IC is mounted, without a package, directly on wiring drawn out on the part which is an extension of one of two glass substrates, between which a liquid crystal is encapsulated.

Here, when light enters into an IC chip, the operating voltage changes, for example, to cause malfunction or operation stoppage, and therefore the reliability of the IC is lowered. Especially for an IC chip comprising an analog circuit, the possibility of causing an error in the circuit due to the effect of light is higher than that for an IC chip comprising a digital circuit.

The thickness of a metal wiring layer and a polyimide layer in the IC is 1 µm or less, which do not have a light-shielding effect.

As a conventional light-shielding measure, there are known techniques such as: a configuration to provide a tube-shaped heat-shrinkable film, which has light shieldability, on a mounting unit of an IC chip (Japanese Unexamined Patent Publication No. 11-24605); a configuration to provide a light-shielding layer on a surface (the surface not facing opposite to the glass substrate) of an IC chip or an LCD screen (Japanese Unexamined Patent Publication No. 2001-56478); or a configuration to place a light-shielding sheet member on a surface facing opposite to the mounting surface of an IC chip on a glass substrate (Japanese Unexamined Patent Publication No. 2001-154601).

Mounting a tube-shaped heat-shrinkable film for the purpose of light shielding is complicated and puts a heavier burden on module manufacturers who assemble liquid crystal display devices. Further, in the COG mounting method, the light entered from a side surface of a glass substrate spreads inside the glass substrate and reaches inside an IC chip even if light-reflecting coating is applied on the back surface of the glass substrate.

Therefore, the present invention aims to provide a bumped IC which can surely shield the light at a region to be shielded from the light, as well as a display device and an electronic device using the bumped IC.

SUMMARY

A bumped IC according to an aspect of the present invention can comprise an input-output circuit; a plurality of internal circuits; a plurality of substrate-coupling bumps which are coupled to the input-output circuit; and at least one dummy bump. The at least one dummy bump is placed opposite to at least one of the internal circuits which becomes the object of light shielding.

According to the aspect of the present invention, the internal circuit is shielded from the light by the dummy bump, and therefore a light-shielding measure can be taken using the IC alone. Since the dummy bump can be formed with a width which can cover a plurality of transistors having lines and spaces of submicron-order sizes, the light-shielded region can be shielded from the light even with one dummy bump. If the light-shielded region has a width wider than that of one dummy bump, a plurality of dummy bumps can be placed side by side.

According to the aspect of the present invention, the height of at least one dummy bump can be made lower than that of the plurality of substrate-coupling bumps. Since the dummy bump does not need to be coupled to the wiring on the substrate, there is no problem if the height of the dummy bump is lower than that of the substrate-coupling bumps. Further, with such a configuration, the breakage of the internal circuits occurring when the substrate and the IC are coupled via the bump can be prevented because the stress applied to the internal circuit which needs to be shielded from the light is not excessive. In addition, even if the substrate placed opposite to the dummy bump has wiring, contact between the dummy bump and the wiring can be prevented.

According to the aspect of the present invention, a dummy electrode to be coupled to at least one dummy bump can further be provided. This is because the existence of the dummy electrode makes it easier to form the dummy bump on the IC. However, the dummy electrode is a floating electrode which is not wired to any part.

According to the aspect of the present invention, one of the plurality of internal circuits is an internal power supply circuit; and the at least one of the internal circuits which becomes the object of light shielding can be an analog circuit which is provided on the internal power supply circuit. In a digital circuit, which operates mainly by switching, the bad influence of malfunction due to light incidence is small. However, in the analog circuit provided on the power supply circuit, generated voltage changes due to light incidence, affecting the operational reliability.

The analog circuit as the object of light shielding can include an element which has a temperature-voltage dependency. Alternatively, the analog circuit as the object of light shielding can include a temperature sensor which detects the actual temperature based on a temperature-voltage dependency. This is because the temperature-voltage dependency, which is secured depending on the characteristics of a transistor, changes due to light incidence into the transistor.

A display device according to another aspect of the present invention can comprise the bumped IC described above and a transparent substrate on which the bumped IC is mounted by means of COG. The transparent substrate has a plurality of wires, and the plurality of substrate-coupling bumps on the bumped IC are coupled to the plurality of wires, but the dummy bump is not coupled to. Yet another aspect of the present invention defines an electronic device which has the display device described above. Such a kind of electronic device includes cellular phones, personal computers, etc., in which the display device is used as an output device.

In the above display device and the electronic device, the dummy bump can prevent the light which transmits through or spread within the transparent substrate from entering into the light-shielded region. Therefore, the reliability of display behavior, which is easy to be perceived visually by users, can be improved.

DETAILED DESCRIPTION

An embodiment of the present invention will now be described with reference to the accompanying drawings.

Display device having a bumped driver IC

Figure 1:
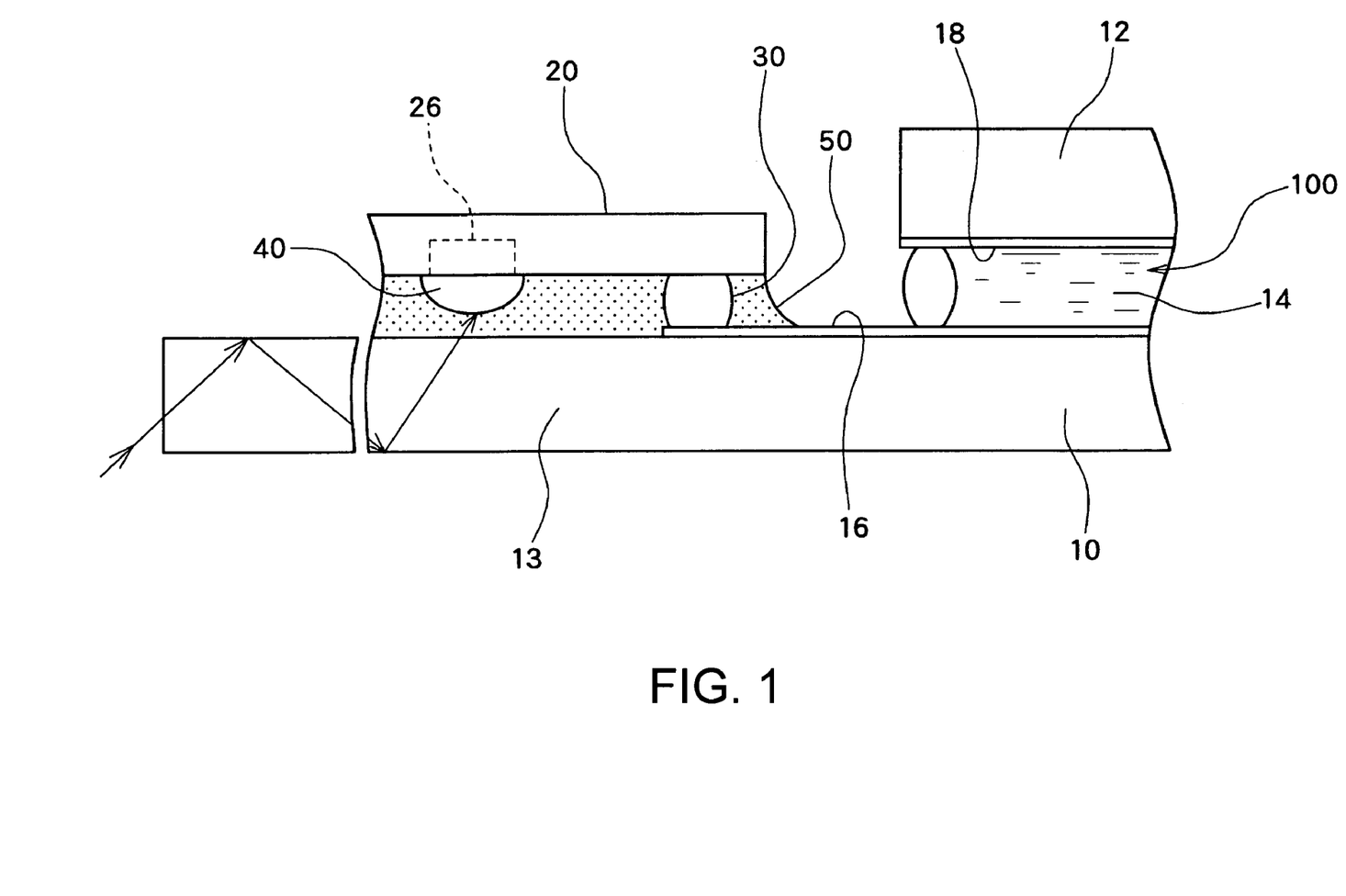
FIG. 1 is a partial cross-sectional view of a liquid crystal display device according to the present invention.

FIG. 1 is a partial cross-sectional view of an active matrix liquid crystal display device. The active matrix liquid crystal display device comprises an active matrix substrate (glass substrate) 10, an opposed substrate (glass substrate) 12, and a liquid crystal 14 encapsulated between the substrates 10 and 11. The active matrix substrate 10 has an extension 13 which is made longer than one end of the opposed substrate 12. On the extension 13, a driver IC 20 is mounted by means of COG. On the opposed substrate 12, a common electrode 18 is formed.

Figure 5:
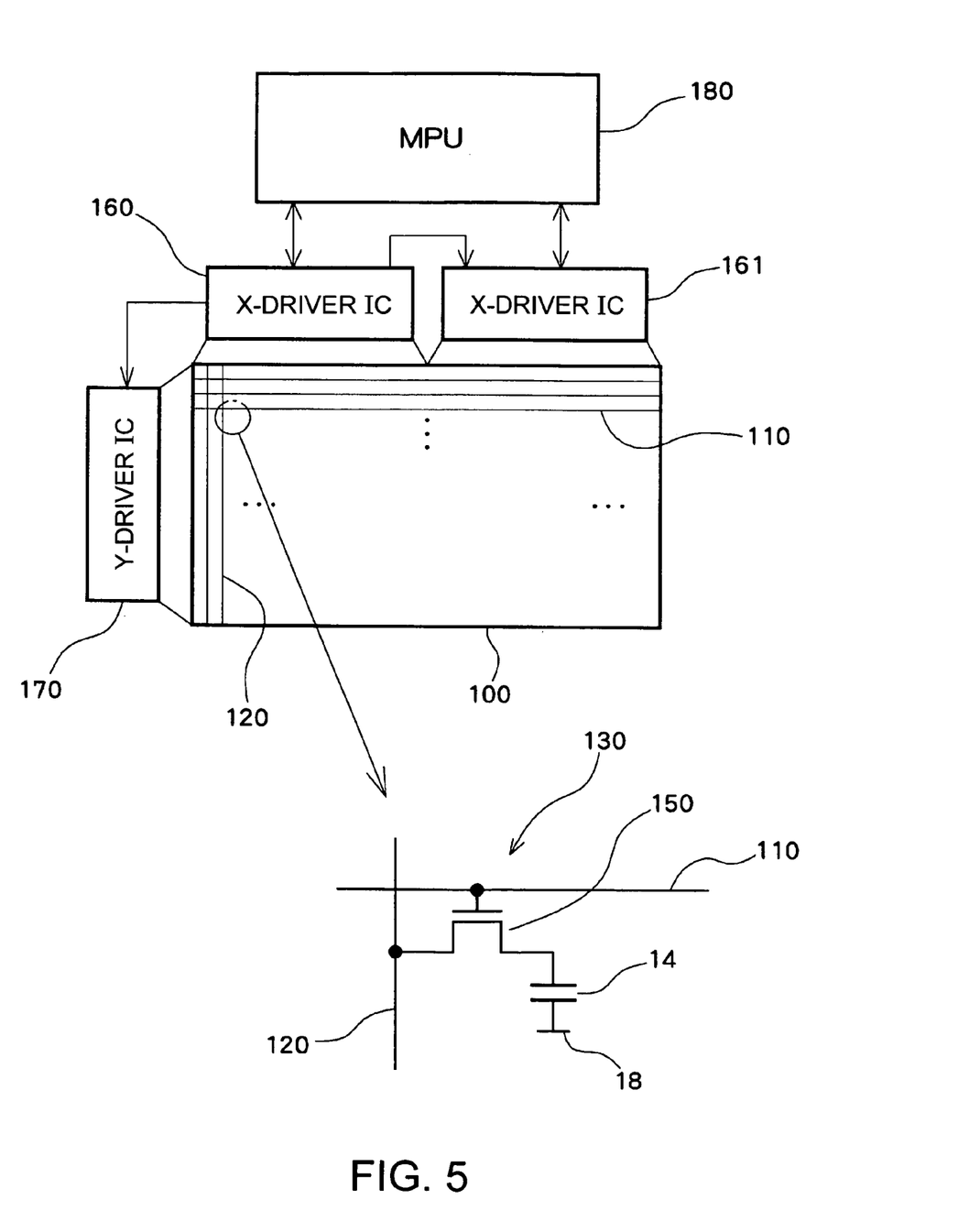
FIG. 5 is a schematic explanatory drawing of a liquid crystal display device according to the present invention.

In a liquid crystal-encapsulating region 100 on the active matrix substrate 10, a plurality of scanning signal lines 110 stretching in the horizontal direction and a plurality of data signal lines 120 stretching in the vertical direction are formed, around each intersection of which a plurality of pixel regions 130 are formed. Further, on each of the plurality of pixel regions 130, a thin film transistor (TFT) 150, for example, is formed as a pixel switch coupled to the liquid crystal 14. In addition, the pixel switch 150 can be another three-terminal element other than TFT, or a two-terminal element such as MIM (metal-insulator-metal), etc.

FIG. 5 shows a master X-driver 160 which drives the plurality of data signal lines 120, a slave X-driver 161, and a Y-driver 170 which drives the plurality of scanning signal lines 110. The X-drivers 160 and 161 and the Y-driver 170 are mounted on the active matrix substrate 10, shown in FIG. 1, by means of COG.

The two X-driver ICs 160 and 161 have a common configuration as the driver IC 20 shown in FIG. 1. The driver IC 20 drives the plurality of data signal lines 120 by being coupled to wiring 16 formed on the extension 13 of the active matrix substrate 10.

The driver IC 20 has a substrate-coupling bump 30. The substrate-coupling bump 30 is coupled to the wiring, for example a plurality of anisotropic conductive films, 16 formed on the extension 13 of the active matrix substrate 10. A part of the wiring 16 is coupled to the data signal line 120 formed on the active matrix substrate 10, and another part of the wiring 16 is coupled to an MPU 180 (refer to FIG. 5), etc. placed outside the active matrix substrate 10.

Figure 2:
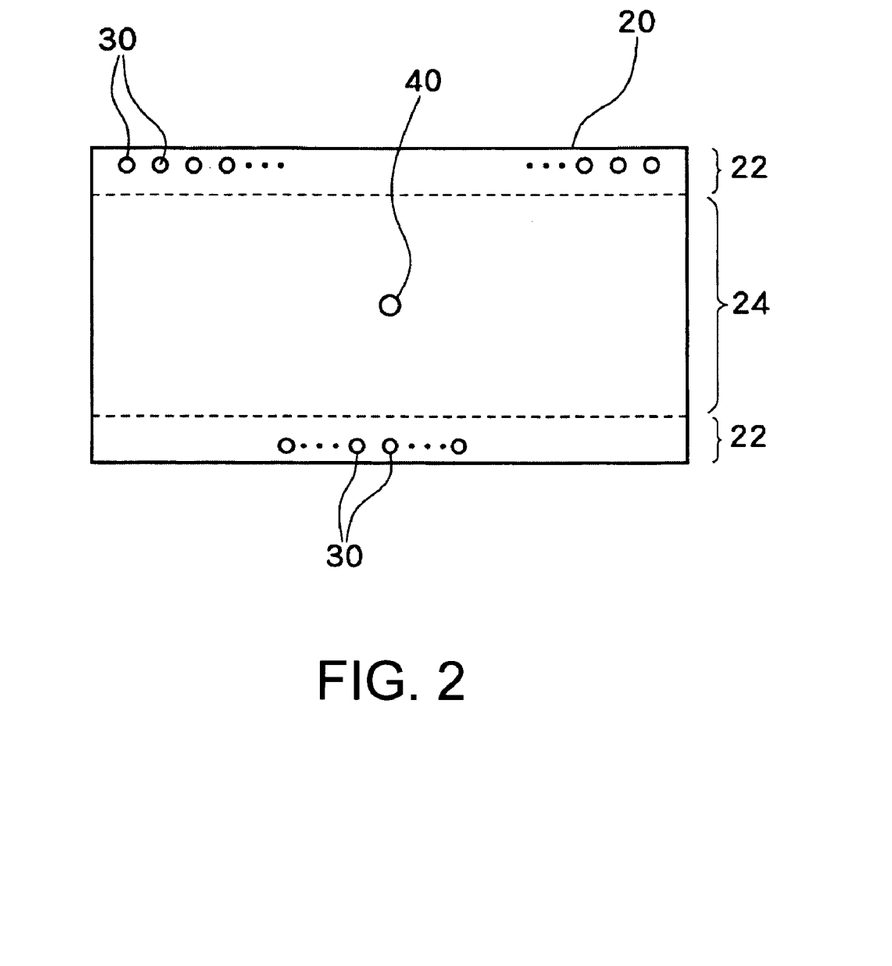
FIG. 2 is a top view of a driver IC.

The driver IC 20 has, as shown in FIG. 2, input-output circuits 22 and 22 along, for example, two long sides. In addition, the input-output circuits 22 can be provided along other sides. On one of the input-output-circuits 22, the plurality of substrate-coupling bumps 30 coupled to the plurality of data signal lines 120 are provided. On the other of the input-output circuits 22, the plurality of substrate-coupling bumps 30 coupled to the external MPU 180, etc. are provided.

The driver IC 20 has, as shown in FIG. 2, an internal circuit region 24 between the two input-output circuits 22 and 22. In the internal circuit region 24, various internal circuits such as a power supply circuit, a temperature sensor, a RAM, a liquid crystal driver circuit, etc. are placed.

The driver IC 20 has, as shown in FIG. 1 and FIG. 2, a dummy bump 40, for example. The dummy bump 40 is, as shown in FIG. 2, placed at a position opposite to the internal circuit region 24 of the driver IC 20.

In the internal circuit region 24, there is a region to be shielded from the light. A specific example will be described later. As shown in FIG. 1, the dummy bump 40 is placed at a position opposite to an internal circuit as the object of light shielding 26, which is included in the plurality of internal circuits of the driver IC 20. The dummy bump 40 is not coupled to the input-output circuit 22 but provided for the purpose of light shielding. Normally, a bump is made of metal (gold, platinum, nickel, chromium, titanium, etc.) and has a height of, for example, 15 to 22 μm, which provides a sufficient light-shielding function.

On the extension 13 of the transparent active matrix substrate 10, light rarely enters from the back surface. Moreover, a reflecting layer (not illustrated) can be provided on the back surface for prevention of light incidence from the back surface. However, the reflecting layer on the back surface cannot prevent the light, which enters from the side edges of the active matrix substrate and spread within the substrate 10, from entering into the driver IC 20, as shown in FIG. 1. The dummy bump 40 prevents not only the light transmitting through the substrate 10 but also the light spreading within the substrate 10 from entering into the internal circuit as the object of light shielding 26.

While the substrate-coupling bump 30 is coupled to the wiring 16, the dummy bump 40, which is not formed for the purpose of substrate coupling, is never coupled to the wiring 16. Therefore, as shown in FIG. 1, the wiring 16 is not formed at a position opposite to the dummy bump 40. If the wiring 16 is to be provided, the dummy bump 40 can be formed lower than the substrate-coupling bump 30 so that the height of the dummy bump 40 does not reach the surface of the active matrix substrate 10. In addition, between the bottom surface of the driver IC 20 and the surface of the active matrix substrate 10, an under-filling material 50 can be filled.

Bump-forming Method

The substrate-coupling bump 30 and the dummy bump 40 can be formed by applying known bump-forming methods, including a printing method, as well as a bump-forming method using a soldering paste described in, for example, Japanese Unexamined Patent Publication No. 2001-135667, Japanese Unexamined Patent Publication No. 9-237963, etc.

In FIG. 4A to FIG. 4E, the bump-forming method described in Japanese Unexamined Patent Publication No. 2001-135667 is applied to the substrate-coupling bump 30 and the dummy bump 40 in FIG. 1.

Figure 4A:
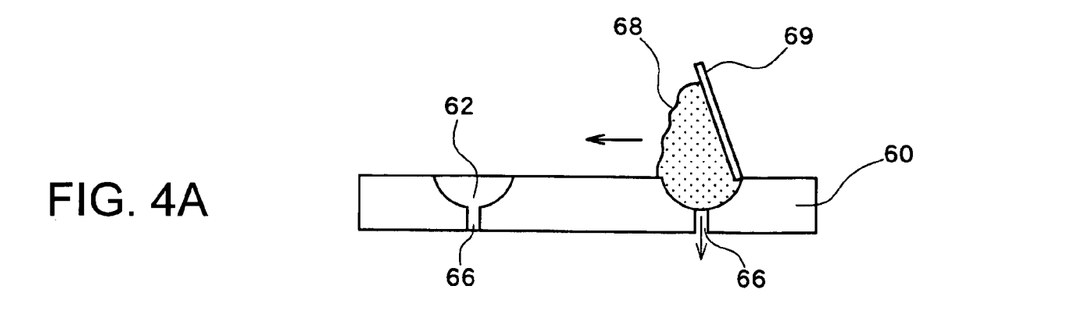
FIG. 4A to FIG. 4E are process drawings of a method for forming a substrate-coupling bump and a dummy bump.

In a bump-forming mold 60 shown in FIG. 4A, concavities 62 (only two are illustrated) for forming the substrate-coupling bump 30 and the dummy bump 40 are formed. The concavities 62 are formed by performing half-etching on the mold 60. The depth of etching is all the same. Especially, by employing a photoreactive glass as a material of the mold 60, the mold 60 can be formed with a high precision by means of photo-etching. In addition, the round concavities shown in FIG. 4A, which can be formed by means of isotropic etching, can be changed to square grooves by means of anisotropic etching. Further, on the mold 60, an air vent 66 piercing from the bottom of each concavity 62 through to the back surface of the mold 60 is formed.

A paste 68 to be filled into the concavity 62 is a powder gold material for forming bumps mixed into a binder. The paste 68 is filled into the concavity 62 using a squeegee 69, as shown in FIG. 4A. Here, by releasing the air through the vent 66, a necessary amount of the paste 68 can surely be filled into the concavity 62 without making any void in the concavity 62 (refer to FIG. 4B).

Figure 4B:
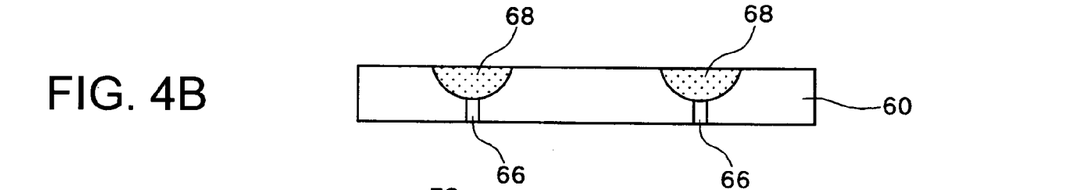
Figure 4C:
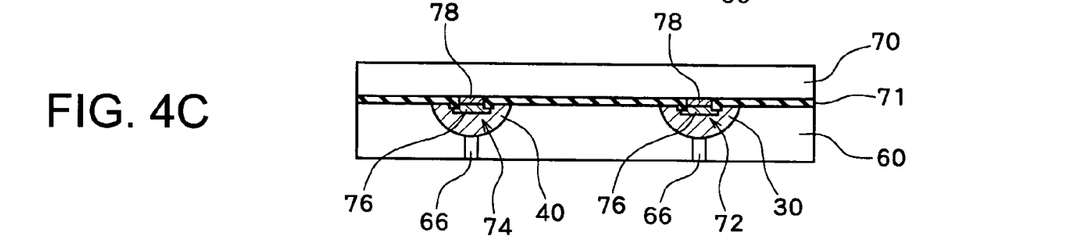

Next, as shown in FIG. 4C, a workpiece 70, such as a semiconductor wafer on which a number of the driver ICs 20 are formed, is placed on the mold 60. Here, on the workpiece 70, an electrode 72 and a dummy electrode 74 are formed. Each of the electrodes 72 and 74 has a thin-flat pad 76 and an under-bump metal 78 formed on the pad 76. The under-bump metal 78 is provided to prevent a bump-forming material from being diffused into the pad 76. On the workpiece 70, a passivation film 71 is formed avoiding at least a part of the electrode 72 and the dummy electrode 74. The electrode 72 is coupled to the input-output circuit 22 shown in FIG. 2, whereas the dummy electrode 74 is a floating electrode.

Under the state shown in FIG. 4C, the paste 68 is solidified contacting to the electrode 72 and the dummy electrode 74. For example, the paste 68 is heated and melted at a temperature over the melting point of a conductive material in the paste 68, and then cooled and solidified. During heating, the gasified binder and decomposed materials are released through the vent 66, and therefore no void is made in the formed bump.

Figure 4D:
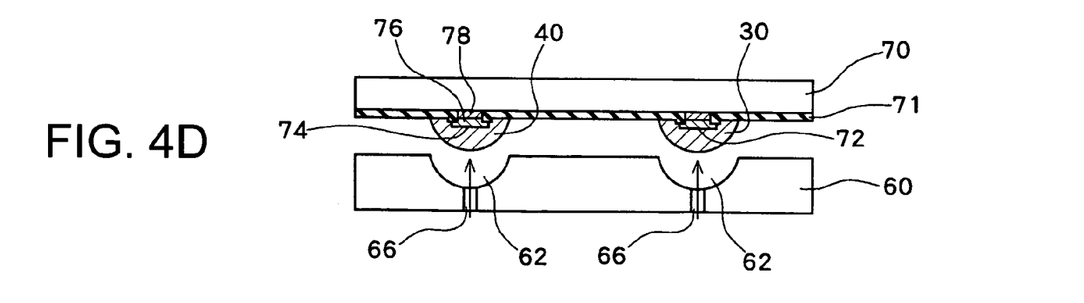

Then, as shown in FIG. 4D, the workpiece 70 on which the bumps 30 and 40 are formed is separated from the mold 60. Here, since the air flows in through the vent 66, the separation can be performed better.

Figure 4E:
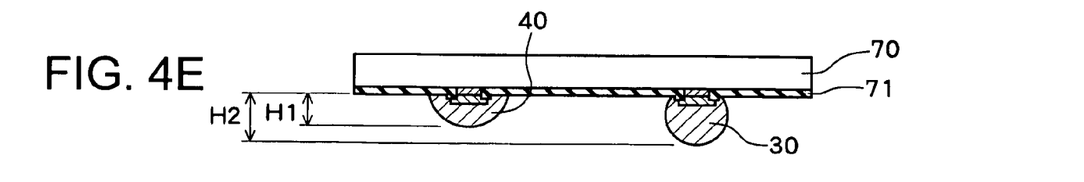

In a step shown in FIG. 4E, only the substrate-coupling bump 30 is melted by heating, formed in a ball shape with a surface tension, and solidified to make a ball bump. Thus, a height H2 of the substrate-coupling bump 30 can be made higher than a height H1 of the dummy bump 40, which is specified by the round shape of the concavity 62 in the mold 60 (H2>H1).

In addition, instead of the mold 60 used in FIG. 4A, a mold 61 can also be used. On the mold 61, the first concavity 62 for forming the substrate-coupling bump 30 and the second concavity 64 for forming the dummy bump 40 are formed. The first and the second concavities 62 and 64, which are formed by performing half-etching on the mold 61, have different etching depths. For example, the etching process is divided in two steps. In the first etching step, the first and the second concavities 62 and 64 are etched. Then, in the second etching step, only the first concavity 62 is etched by masking the second concavity 64. Thus, the second concavity 64 can be formed shallower than the first concavity 62.

After the paste 68 is filled into the mold 61 in FIG. 4A, the same process in FIG. 4B to FIG. 4D is performed. Then, both of the substrate-coupling bump 30 and the dummy bump 40 are melted by heating, formed in a ball shape with a surface tension, and solidified to make ball bumps. In such a method, the height of the substrate-coupling bump 30 can be made higher than that of the dummy bump, while forming both of the substrate-coupling bump 30 and the dummy bump 40 in a ball-bump shape.

Figure 3:
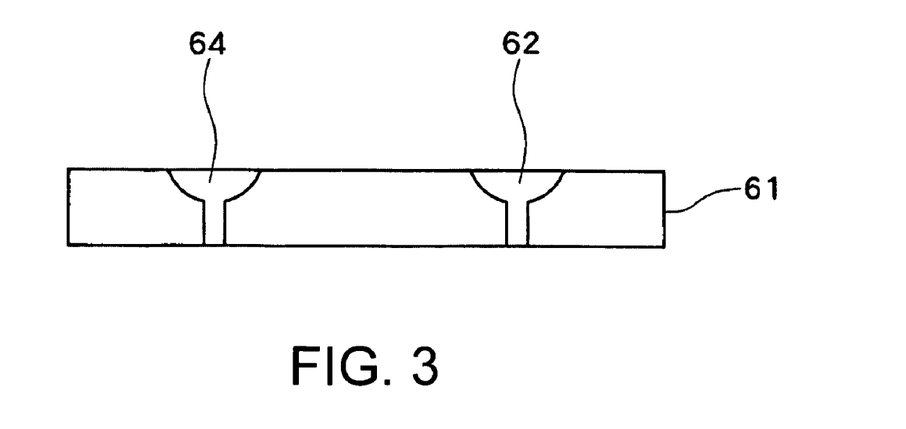
FIG. 3 is a drawing of a variant of a mold in FIG. 4A.

Alternatively, using the mold 61 in FIG. 3, only the substrate-coupling bump 30 can be melted by heating in the step shown in FIG. 4E, formed in a ball shape with a surface tension, and solidified to make a ball bump. Thus, the height of the dummy bump 40 becomes the height specified by the round shape of the second concavity 64 in the mold 61, which is still lower than that of the substrate-coupling bump 30.

In addition, a semiconductor wafer as the workpiece 70, on which the bumps 30 and 40 are formed as shown in FIG. 4E, is cut for each unit of the driver IC 20. Then, the driver IC 20 is mounted on the active matrix substrate 10 in FIG. 1 by means of COG. Here, it is preferable not to melt the dummy bump 40. As a preventive measure, for example, bump-forming materials can be selected so that the melting point of the material for the dummy bump 40 is higher than that of the material for the substrate-coupling bump 30.

Internal Circuit of the Driver IC

Figure 6:
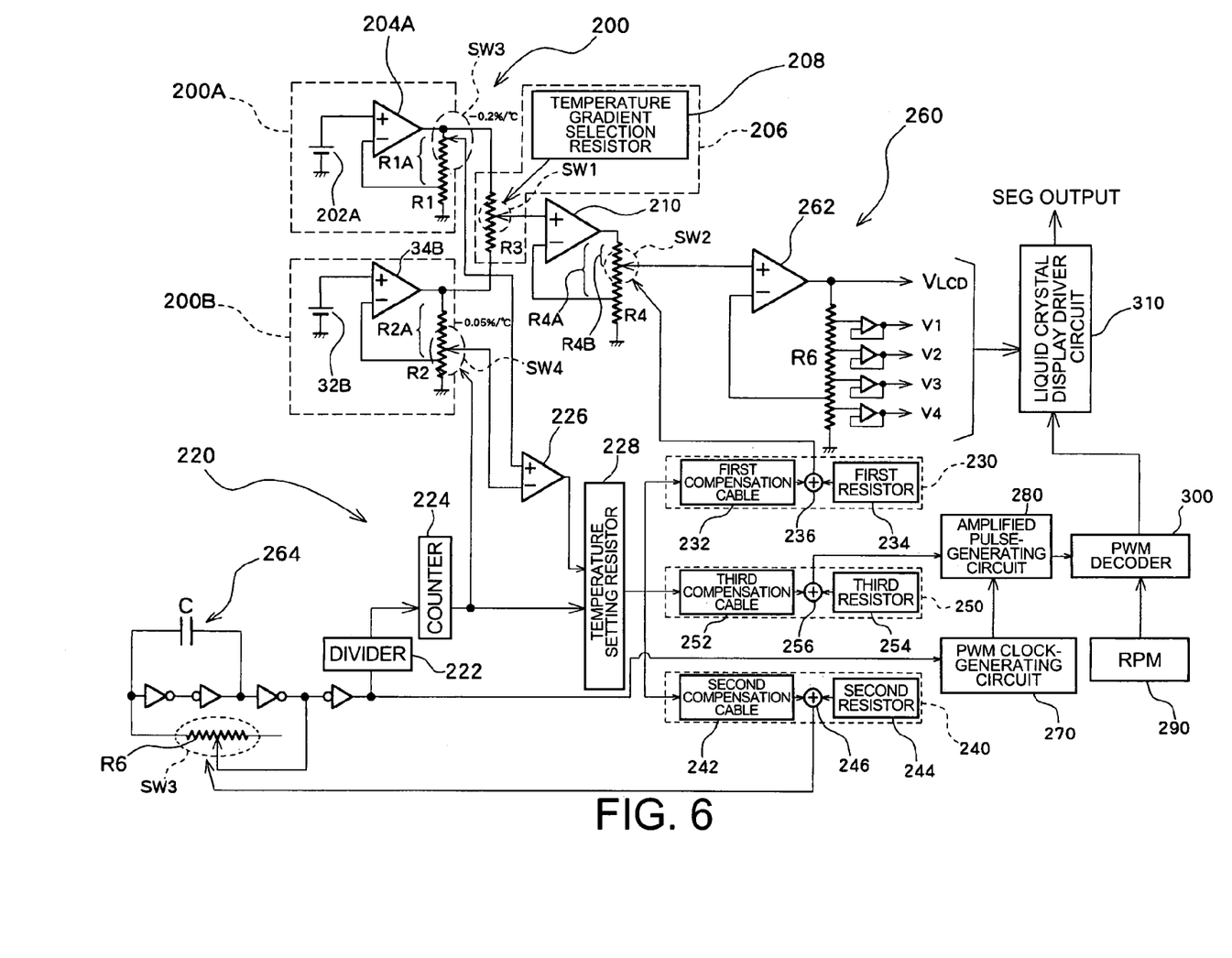
FIG. 6 is a block diagram of an internal circuit of a driver IC.

FIG. 6 shows an example of an internal circuit of the driver IC 20. The internal circuit comprises an analog circuit, wherein especially a power supply circuit 200 and a temperature sensor 220 become the objects of light shielding.

In FIG. 6, as major blocks built in the driver IC 20, the following function blocks are provided. The power supply circuit 200 generates a reference voltage which is required for driving the liquid crystal. A voltage-generating circuit 260 generates, based on the output from the power supply circuit 200, voltages $V_{LCD}$ and V1 to V4 which are required for driving the liquid crystal. In a memory unit, a RAM 290 for example, display data (gradient data) which is supplied from the MPU 180 is stored. An oscillator circuit 264 oscillates and output a reference frequency. Further, a pulse width modulation (PWM) clock-generating circuit 270, which generates a PMW clock (GCP) based on the oscillatory frequency from the oscillator circuit 264, is provided. A gradient pulse-generating circuit 280 generates a gradient pulse for a plurality, 32 for example, of gradients corresponding to each gradient value, based on the PWM clock. A PWM decoder 300 selects, based on the gradient data from the RAM 290, a corresponding gradient pulse and outputs the gradient pulse for each line. A display driver circuit 310 shifts, based on a non-illustrated polarity inversion signal, etc., the wave height of the gradient pulse from the PWM decoder 300 to each of the voltages $V_{LCD}$ and V1 to V4 from the voltage-generating circuit 260 or a ground voltage $V_{GND}$, which is supplied to the plurality of corresponding data signal lines 120 shown in FIG. 5.

The power supply circuit 200 shown in FIG. 6 comprises the first power supply circuit 200A having the first temperature-voltage characteristic, the second power supply circuit 200B having the second temperature-voltage characteristic, and a temperature gradient selection circuit 206 which outputs, based on the output voltages from the first and the second power supply circuits 200A and 200B, a voltage in accordance with the voltage characteristic having a desired temperature gradient.

Figure 7:
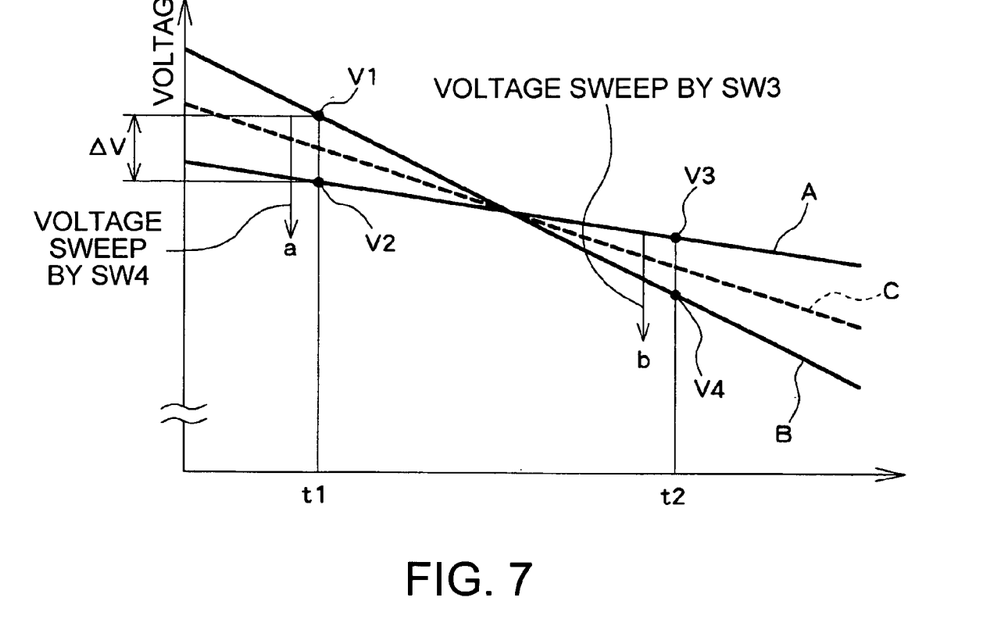
FIG. 7 is a diagram of temperature gradient characteristics of an output voltage from a power supply circuit shown in FIG. 6.

The first power supply circuit 200A outputs a voltage A which varies in accordance with the temperature-voltage characteristic of the first temperature gradient (for example, −0.2%/° C.) shown in FIG. 7. On the other hand, the second power supply circuit 200B outputs a voltage B which varies in accordance with the temperature-voltage characteristic of the second temperature gradient (for example, −0.5%/° C.) shown in FIG. 7. Further, the temperature gradient selection circuit 206 selects and outputs a voltage C of a desired temperature gradient between the voltages A and B of the first and the second temperature gradients shown in FIG. 7.

The first power supply circuit 200A outputs a voltage from a constant voltage source 202A having the first temperature gradient characteristic after amplifying at a specific gain using the first amplifier 204A. Between the output line of the first amplifier 204A and the ground, a resistor R1 is coupled. By coupling a halfway point of the resistor R1 to the negative terminal of the amplifier 204A, a feedback resistor R1A is formed on the feedback route of the first amplifier 204A.

The second power supply circuit 200B outputs a voltage from a constant voltage source 202B having the second temperature gradient characteristic after amplifying at a specific gain using the second amplifier 204B. Between the output line of the second amplifier 204B and the ground, a resistor R2 is coupled. By coupling a halfway point of the resistor R2 to the negative terminal of the amplifier 204B, a feedback resistor R2A is formed on the feedback route of the second amplifier 204B.

In addition, the first and the second temperature gradients described above are made dependent on the process characteristics of an MOS transistor which configures the first constant voltage source 32A and the second constant voltage source 32B, and determined by utilizing the difference in the characteristics of a threshold Vth of the transistor. Further, when the light enters into the MOS transistor configuring the first constant voltage source 32A and the second constant voltage source 32B, the threshold Vth of the MOS transistor is changed, which further changes the first and the second temperature gradients, resulting in a variation of the generated voltage. Therefore, the first constant voltage source 32A and the second constant voltage source 32B of the power supply circuit 200 can especially be considered as the objects of light shielding.

The temperature gradient selection circuit 206 comprises a resistor R3 which is inserted and coupled to a halfway point of the coupling line between the output lines of the first and the second amplifiers 204A and 204B, a switch SW1 which is coupled to any halfway point on the resistor R3, and a temperature gradient selection resistor 208 which stores the coupling position information of the switch SW1.

The temperature gradient selection resistor 208 is a programmable resistor, with which the user can select a temperature gradient freely. However, once a liquid crystal panel to be used is specified, a temperature gradient specific to the liquid crystal panel is selected, which will never be changed. Here, it is supposed that the initial setting of the temperature gradient selection resistor 208 has already been made and that the output voltage from the power supply circuit 200 has the voltage characteristic C in FIG. 7.

In the latter part of the temperature gradient selection circuit 206, the third amplifier 210 is provided. Between the output line of the third amplifier 210 and the ground, a resistor R4 is coupled. By coupling a halfway point of the resistor R4 to the negative terminal of the third amplifier 210, a feedback resistor R4A is formed on the feedback route of the third amplifier 210.

The first electron volume switch SW2 is a switch coupled to any halfway point on the feedback resistor R4A of the third amplifier 210. Here, a resistor selected by the first electron volume switch SW2 is represented as a resistor R4B, as shown in FIG. 6. By giving a variability to the value of the resistor R4B selected by the first electron volume switch SW2, the voltage characteristic C shown in FIG. 7 can further be compensated.

The voltage-generating circuit 260 provided in the latter part of the first electron volume switch SW2 comprises the fourth amplifier 262 to which a voltage is input via the first electron volume switch SW2, and a resistor R5 coupled between the output line of the fourth amplifier 262 and the ground. Further, the output of the fourth amplifier 262 is represented as the voltage $V_{LCD}$, which is divided using the resistor R5 to generate each of the voltages V1 to V4.

In the present embodiment, by controlling the first electron volume switch SW2 in accordance with ambient temperatures, the voltage characteristic C shown in FIG. 7 is further compensated in accordance with ambient temperatures.

Therefore, in the present embodiment, a temperature sensor 220 which detects the ambient temperature by utilizing the two kinds of temperature characteristics shown in FIG. 7 is provided. As shown in FIG. 6, the temperature sensor 220 comprises: a divider 222 which divides the oscillatory output of the oscillator circuit 264; a counter 224 which counts a clock from the divider 222 and is reset for every specified count; the first temperature detection switch SW3 which is coupled to the feedback resistor R1A coupled to the first amplifier 204A in the first power supply circuit 200A; the second temperature detection switch SW4 which is coupled to the feedback resistor R2A coupled to the second amplifier 204B in the second power supply circuit 200B; a comparator 226 which compares the voltages that are input via the first and the second temperature detection switches SW3 and SW4; and a temperature setting resistor 228 which outputs data corresponding to the actual temperature, based on the output of the counter 224 when the comparator 226 makes a change.

Here, one of the temperature detection switches SW3 and SW4 changes the coupling point from one end to the other end of the feedback resistors R2A and R3A by turns every time the output from the counter 224 changes. For example, when the switch SW4 is switched with the switch SW3 fixed at the position shown in FIG. 6, the voltage which is input to the comparator 226 via the temperature detection switch SW4 is swept toward an arrow direction a in FIG. 7. That is, in order to detect an arbitrary temperature t1 in FIG. 7, the voltage which is input to the comparator 226 via the temperature detection switch SW4 is swept from the voltage V1 on the voltage characteristic B. The swept voltage becomes lower than the voltage V2 on the voltage characteristic A (the voltage which is input to the comparator 226 via the temperature detection switch SW3) at a certain point, when the output of the comparator 226 changes from 'H' to 'L'. Here, if the voltage variation is represented as ΔV, the variation ΔV is a value specific to the temperature t1. Therefore, the temperature setting resistor 228 can output the actual temperature t1 based on the count value (which corresponds to the voltage variation ΔV) of the counter 224 shown when the output of the comparator 226 changes.

In order to detect an actual temperature t2, the voltage which is input to the comparator 226 via the temperature detection switch SW3 can be swept toward an arrow direction b in FIG. 7 by switching the switch SW3 with the switch SW4 fixed. Thus, the voltage swept from V3 becomes lower than the voltage V4 at a certain point, when the output of the comparator 226 changes from, for example, 'L' to 'H'. As a result, the actual temperature t2 can be detected in the same manner as described above. In addition, the output line of the counter 224 shown in FIG. 6 is also coupled to the temperature detection switch SW3, which is omitted in FIG. 6.

Further, the actual temperature t1 or t2 can also be detected by coupling and fixing the input line for the negative terminal of the comparator 226 to the intermediate point of the resistor R1 without taking the route to the switch SW3, and then moving the coupling point of the switch SW4 from the ground side of the resistor R2 toward the output-line side of the second amplifier 204B.

Thus, it becomes possible for the temperature sensor 220 to detect the actual temperature by utilizing the temperature gradient characteristics of the power supply circuit 200 per se. As described above, since the liquid crystal applied voltage is compensated based on the actual temperature detected by using two kinds of temperature gradients obtained by providing the constant voltage sources 200A and 200B, which have two kinds of temperature gradients, on the power supply circuit 200, more precise compensation can be achieved. However, the temperature sensor 220 also uses the first and the second temperature gradients of the power supply circuit 200. Therefore, light incidence into the MOS transistor which configures the first constant voltage source 202A and the second constant voltage source 202B leads to a false temperature detection.

Based on the actual temperature which is an output of the temperature setting resistor 228, the first electron volume switch control unit 230 which controls the first electron volume switch SW2 comprises the first compensation table 232, the first resistor 234, and the first adder 236 which adds and outputs the digital values of the first compensation table 232 and the first resistor 234.

A frame frequency compensation circuit is as follows. The CR oscillator circuit 264 having a capacity C and a resistor R6 can change the oscillatory frequency (frame frequency) by changing the resistance of the resistor R6 which is coupled to the oscillator circuit 264.

As shown in FIG. 6, the third electron volume switch control unit 240 which controls the second electron volume switch SW5 based on the actual temperature detected by the temperature sensor 220 is provided. The third electron volume switch control unit 240 comprises the second compensation table 242, the second resistor 244, and the second adder 246 which adds and outputs the digital values of the second compensation table 242 and the second resistor 244. With such a control, the frame frequency is set to a high value in accordance with the liquid crystal with a high reaction rate as the temperature becomes higher and, to the contrary, the frame frequency is set to a low value when the reaction rate of the liquid crystal becomes lower as the temperature becomes lower.

A circuit for compensating the gradient pulse width is as follows. A gradient pulse width compensation circuit 250 shown in FIG. 6 comprises the third compensation table 252, the third resistor 254, and the third adder 256 which adds and outputs the digital values of the third compensation table 252 and the third resistor 254.

In order to compensate the applied voltage-transmissivity characteristics of the liquid crystal, which differ depending on temperatures, gradient compensation values corresponding to temperatures are stored in the third compensation table 252 and read out in accordance with the actual temperature detected by the temperature sensor 220. Thus, temperature compensation can be achieved.

Here, since the power supply circuit 200 and the temperature sensor 220 are shielded from the light by the dummy bump 40, a precise liquid crystal applied voltage can be generated and, at the same time, various compensations can be achieved by detecting precise actual temperatures.

Figure 8:
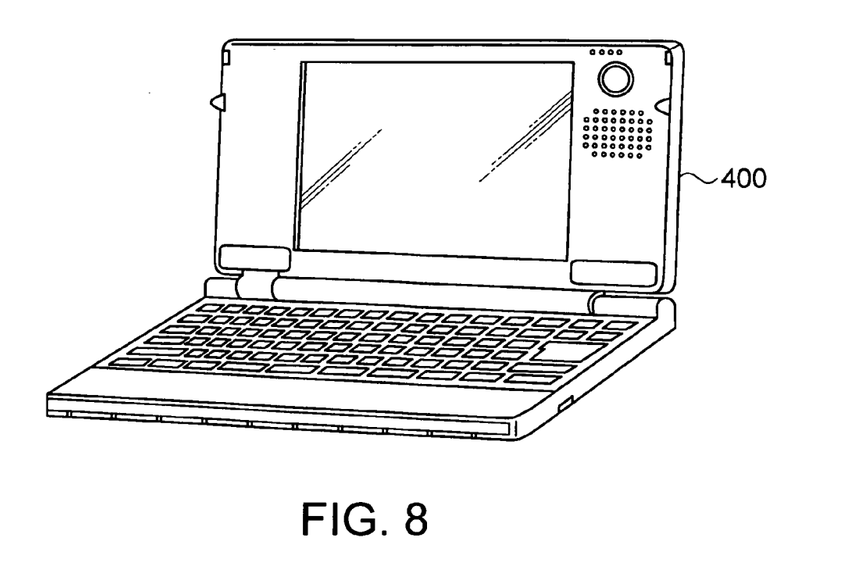
FIG. 8 is a drawing of a personal computer which is an example of an electronic device having a display device.
Figure 9:
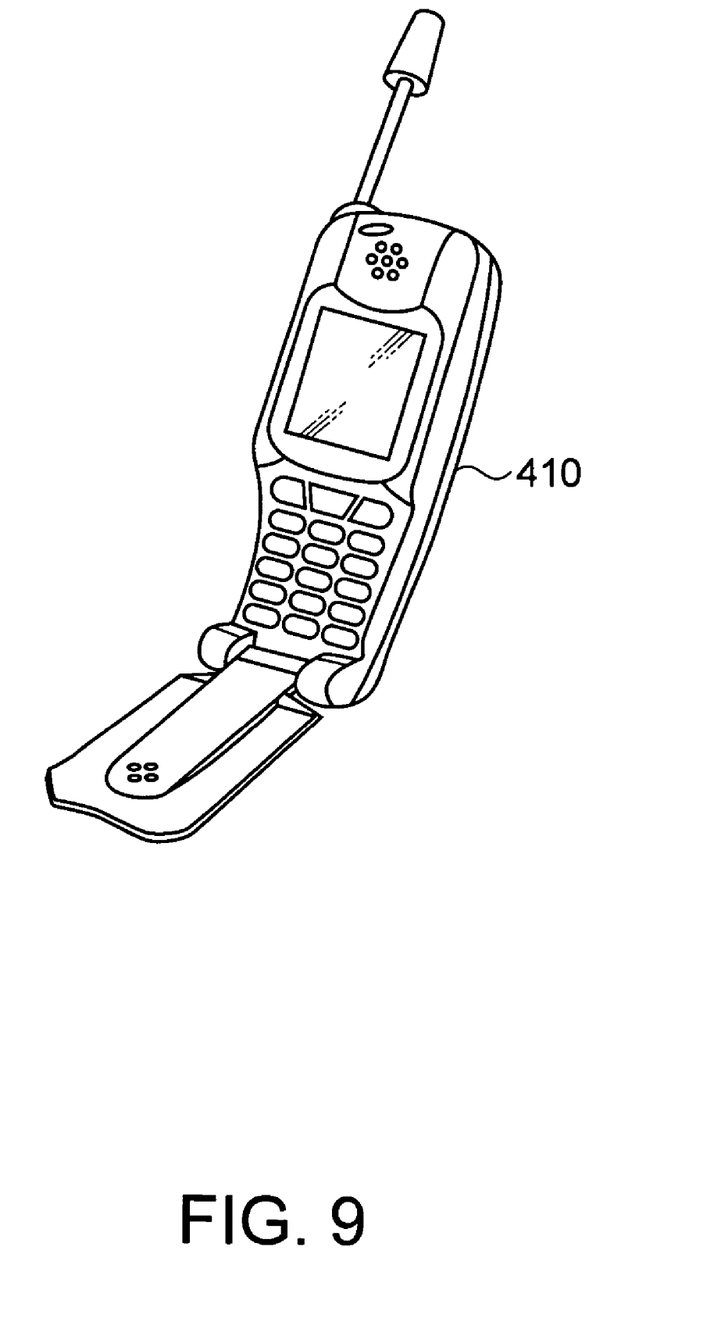
FIG. 9 is a drawing of a cellular phone which is another example of an electronic device having a display device.

In addition, the present invention is not limited to the above-described embodiment. However, various changes can be made within the scope of the present invention. For example, the present invention is not necessarily applied to a driver IC for a display device, and can be applied to other various ICs having an internal circuit which requires light shielding. Further, the display device is also not limited to a liquid crystal device, provided that the display device has a configuration wherein a bumped IC is mounted on a transparent substrate by means of COG. As typical examples of an electronic device having a display device, a personal computer 400 shown in FIG. 8 and a cellular phone 410 shown in FIG. 9 can be considered but not limited to such devices.

Further, the method for forming the substrate-coupling bump 30 and the dummy bump 40 is not limited to the methods shown in FIG. 4A to FIG. 4E or FIG. 3.

Though different from the present invention to shield light using the bump, it is also possible to shield light by applying ink, instead of the bump, on the region to be light-shielded. For example, at a position opposite to the light-shielded region on the IC passivation film, ink can be applied by an ink-marker method which is employed for defective marking after a probe test; or an ink-jet method which is employed in printers. It is preferable that there is a dent on the passivation film on which ink is to be applied. The dent, which can be formed when the passivation film is processed, can be formed by utilizing a difference in level which is naturally made on the passivation film because the number of metal wiring layers is small. Especially, the number of metal wiring layers of an analog circuit which becomes the object of light shielding is smaller than that of a digital circuit, and therefore a dent can be formed on the passivation film opposite to the analog circuit and ink can be applied on the dent.

What is claimed is:

1. A bumped IC, comprising:
    an input-output circuit;
    a plurality of internal circuits;
    a plurality of substrate-coupling bumps which are coupled to the input-output circuit; and
    at least one dummy bump,
    wherein the at least one dummy bump is placed opposite to at least one of the internal circuits which becomes an object of light shielding.

2. The bumped IC according to claim 1, wherein a height of the at least one dummy bump is lower than a height of each of the plurality of substrate-coupling bumps.

3. The bumped IC according to claim 1, further comprising a dummy electrode which is coupled to the at least one dummy bump, wherein the at least one dummy electrode is a floating electrode.

4. The bumped IC according to claim 1, wherein one of the plurality of internal circuits is an internal power supply circuit; and the at least one of the internal circuits which becomes an object of light shielding is an analog circuit which is provided on the internal power supply circuit.

5. The bumped IC according to claim 4, wherein the analog circuit includes an element which has a temperature-voltage dependency.

6. The bumped IC according to claim 4, wherein the analog circuit includes a temperature sensor which detects an actual temperature based on the temperature-voltage dependency.

7. A display device, comprising:
    the bumped IC according to claim 1; and
    a transparent substrate on which the bumped IC is mounted by means of chip-on-glass (COG),
    wherein the transparent substrate has a plurality of wires and the plurality of substrate-coupling bumps on the bumped IC are coupled to the plurality of wires.

8. An electronic device, comprising the display device according to claim 7.

* * * * *